United States Patent
Vesterinen et al.

(10) Patent No.: US 11,377,346 B2
(45) Date of Patent: Jul. 5, 2022

(54) LOW-NOISE MULTI AXIS MEMS ACCELEROMETER

(71) Applicant: MURATA MANUFACTURING CO., LTD., Nagaokakyo (JP)

(72) Inventors: Hannu Vesterinen, Espoo (FI); Ville-Pekka Rytkönen, Klaukkala (FI); Anssi Blomqvist, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/015,539

(22) Filed: Sep. 9, 2020

(65) Prior Publication Data

US 2021/0070609 A1 Mar. 11, 2021

(30) Foreign Application Priority Data

Sep. 11, 2019 (FI) .................................... 20195753
Oct. 4, 2019 (FI) ..................................... 20195849

(51) Int. Cl.
  *G01P 15/13* (2006.01)
  *B81B 7/00* (2006.01)
  *G01P 15/18* (2013.01)
  *G01P 15/08* (2006.01)

(52) U.S. Cl.
  CPC .......... *B81B 7/0016* (2013.01); *G01P 15/132* (2013.01); *G01P 15/18* (2013.01); *G01P 2015/0862* (2013.01)

(58) Field of Classification Search
  CPC ...... B81B 7/0016; G01P 15/132; G01P 15/18; G01P 2015/0862; G01P 15/0802; G01P 2015/0854; G01P 2015/0857; G01P 2015/0814; G01P 2015/082; G01P 15/125
  See application file for complete search history.

(56) References Cited

U.S. PATENT DOCUMENTS

| | | | | |
|---|---|---|---|---|
| 5,894,091 | A | * | 4/1999 | Kubota ............. G01C 19/5719 73/504.12 |
| 2002/0112538 | A1 | * | 8/2002 | Pinter .................. B81B 3/0008 73/514.32 |
| 2009/0314085 | A1 | | 12/2009 | Stahl et al. |

(Continued)

FOREIGN PATENT DOCUMENTS

DE    10 2009 000 729 A1    8/2010
EP         2 643 702 A1    10/2013
(Continued)

OTHER PUBLICATIONS

Finnish Search Report dated Mar. 23, 2020 corresponding to Finnish Patent Application No. 20195753.
(Continued)

*Primary Examiner* — Xin Y Zhong
(74) *Attorney, Agent, or Firm* — Squire Patton Boggs (US) LLP

(57) ABSTRACT

The present invention provides a high-accuracy low-noise MEMS accelerometer by using a larger, single proof mass to measure acceleration along two orthogonal axes. A novel arrangement of electrodes passively prevents cross axis error in the acceleration measurements. Novel arrangements of springs and a novel proof mass layout provide further noise reduction.

14 Claims, 4 Drawing Sheets

(56) References Cited

U.S. PATENT DOCUMENTS

| | | | |
|---|---|---|---|
| 2010/0122579 A1* | 5/2010 | Hsu | G01P 15/18 73/514.32 |
| 2011/0023606 A1 | 2/2011 | Burghardt et al. | |
| 2013/0192371 A1 | 8/2013 | Rytkoenen et al. | |
| 2016/0187371 A1 | 6/2016 | Sakai et al. | |
| 2017/0184628 A1 | 6/2017 | Hsu et al. | |
| 2017/0363655 A1 | 12/2017 | Zhang | |
| 2018/0038887 A1 | 2/2018 | Zhang et al. | |
| 2018/0188283 A1 | 7/2018 | Mohammed et al. | |
| 2018/0238925 A1 | 8/2018 | Acar et al. | |
| 2019/0064203 A1 | 2/2019 | Tanaka | |
| 2019/0162754 A1 | 5/2019 | Tanaka | |

FOREIGN PATENT DOCUMENTS

| | | |
|---|---|---|
| EP | 3044541 A1 | 7/2016 |
| EP | 3239723 A1 | 11/2017 |
| JP | 2003166999 A | 6/2003 |
| JP | 2015049190 A | 3/2015 |
| WO | WO 2009/099124 A1 | 8/2009 |
| WO | WO 2010/032818 A1 | 3/2010 |

OTHER PUBLICATIONS

Finnish Search Report dated Jun. 2, 2020 corresponding to Finnish Patent Application No. 20195849.
European Search Report dated Jan. 20, 2021 corresponding to European Patent Application No. 20195500.
European Search Report dated Jan. 28, 2021 corresponding to European Patent Application No. 20190424.

* cited by examiner

LOW-NOISE MULTI AXIS MEMS ACCELEROMETER

TECHNICAL FIELD

The present invention relates to microelectromechanical systems (MEMS) and especially to a microelectromechanical structure for measuring accelerations and a corresponding microelectromechanical accelerometer device.

BACKGROUND

Microelectromechanical structures can be used to quickly and accurately detect changes in physical properties, for example measuring the acceleration experienced by an object.

The basic elements of a MEMS accelerometer are a proof mass, surrounding support structures and a spring connecting the proof mass to the support structures. When the MEMS accelerometer experiences an external acceleration, the proof mass is also forced to accelerate due to the spring coupling. However, since the spring is not perfectly stiff, the spring deflects and the distance between the support and the proof mass changes. The change in distance is in proportion to the acceleration, so by measuring the change in distance between the proof mass and the support structures, the acceleration can be measured.

MEMS accelerometers often use capacitive sensors to measure the change in distance between proof mass and support structures. In such a capacitive sensor, electrodes on the support and the proof mass are electrically insulated from each other, and their capacitance is measured. As the distance between the electrodes on the support and proof mass decreases, the capacitance increases. Similarly, when the distance increases, the capacitance decreases.

Deflection of the often is typically arranged to be directional such that the spring responds to displacements of the proof mass along one direction, i.e. along a sense axis, with stiffness of a selected spring constant, and minimises or eliminates displacements of the proof mass in other directions. Depending on the needs of the application, an accelerometer device can be designed for a specific sensitivity, measuring range and frequency response. Accelerometer devices can also be adapted for sensing in two or more directions, i.e. to multi-axis sensing with a combination of separate proof masses that have different sense axes. In an attempt to reduce dimensions of the accelerometer device, it is also possible to use more complex proof mass structures that include a part or parts with more than one degree of freedom, and thereby enable independent detection of displacements in more than one sense axis directions. However, multi-axis sensors with a proof mass structure for more than one degree of freedom include a combination of parts that are nested in a plane and mechanically coupled to each other with directional spring structures. These spring structures tend to allow perpendicular acceleration to the sensed motion, and thereby increase cross axis error, i.e. an incorrect indication of acceleration along a sense axis due to movement of the proof mass along a different axis.

The dimensions of the inertial proof mass are important because they typically determine the range of sensitivity of the detection. Different types of acceleration sensors have different requirements, and a specific challenge is detection of acceleration in different ranges. Sensing of lower accelerations (low-g accelerometers) requires a large proof mass, whereas in higher accelerations (high-g accelerometers) a detectable motion may be achieved with a smaller proof mass.

Furthermore, high accuracy accelerometers, such as those used in electronic stability control systems, generally require independence of each of the sense axes—i.e. an individual proof mass for each sense axis—in order to reduce inaccuracies that result from cross-axis interference. However, the use of individual proof masses for the sense axes reduces the maximum size of each individual proof mass, since MEMS systems are generally subject to significant size constraints. As a result of the smaller proof masses, the accelerometer is more susceptible to noise. Other MEMS accelerometers, such as those used in smartphones, often use a single proof mass for multiple axes in order to keep the complexity of the system (and therefore cost) down. While this enables a larger proof mass to be used, these accelerometers are highly susceptible to cross-axis error and parasitic modes of movement of the proof mass, which significantly reduce the accuracy of these accelerometers.

SUMMARY OF THE INVENTION

The present invention provides a high-accuracy low-noise MEMS accelerometer by using a larger, single proof mass to measure acceleration along two orthogonal axes. A novel arrangement of electrodes passively prevents cross axis error in the acceleration measurements.

The two-axis MEMS accelerometer of the present invention comprises a substrate, which defines a substrate plane, a proof mass and two or more comb capacitors comprising moveable comb electrodes extending from the proof mass and stationary comb electrodes anchored to the substrate.

The invention is characterised in that each comb capacitor comprises:
 a first set of moveable comb teeth that extend away from the proof mass in a first direction along a capacitor axis of the comb capacitor, the capacitor axis being parallel to the substrate plane;
 a second set of moveable comb teeth that extend away from the proof mass in a second direction, opposite the first direction, along the capacitor axis;
 a first set of stationary comb teeth opposite to and interdigitated with the first set of moveable comb teeth, wherein the first set of stationary comb teeth extend towards the proof mass in the second direction; and
 a second set of stationary comb teeth opposite to and interdigitated with the second set of moveable comb teeth, wherein the second set of stationary comb teeth extend towards the proof mass in the first direction.

Movement of the proof mass in the first direction causes the first set of moveable comb teeth and first set of stationary comb teeth to move closer together and causes the second set of moveable comb teeth and second set of stationary teeth to move further apart, and movement of the proof mass in the second direction causes the first set of moveable comb teeth and first set of stationary comb teeth to move further apart and the second set of moveable comb teeth and second set of stationary teeth to move closer together.

Similarly, movement of the proof mass in the first direction may cause the first set of moveable comb teeth and first set of stationary comb teeth to move closer together by a first distance and causes the second set of moveable comb teeth and second set of stationary teeth to move further apart by the first distance, and wherein movement of the proof mass in the second direction causes the first set of moveable comb teeth and first set of stationary comb teeth to move further apart by a second distance and the second set of moveable comb teeth and second set of stationary teeth to move closer together by the second distance.

Movement of the accelerometer in a third direction along a transverse axis, parallel to the substrate plane and perpendicular to the capacitor axis, may causes both the first moveable comb electrodes and first stationary comb electrodes and the second moveable comb electrodes and second stationary comb electrodes to move further apart, and similarly movement of the accelerometer in a fourth direction, opposite to the third direction, along the transverse axis may cause both the first moveable comb electrodes and first stationary comb electrodes and the second moveable comb electrodes and second stationary comb electrodes to move closer together.

A first comb capacitor of the at least two comb capacitors may be arranged such that its capacitor axis lies along or parallel to a first axis, which is parallel to the substrate plane, and wherein a second comb capacitor of the at least two comb capacitors is arranged to that its capacitor axis lies along or parallel to a second axis, which is parallel to the substrate plane and perpendicular to the first axis.

The comb capacitors may be arranged into pairs, and wherein the comb capacitors in each pair are mirror-images of each other reflected about an axis of reflection parallel to and equidistant to the capacitor axes of the pair of comb capacitors.

The accelerometer may comprise four comb capacitors arranged into two pairs, wherein the axes of reflection of each pair intersect at the centre of the substrate.

The stationary electrodes may be anchored to the substrate at or close to the centre of the substrate.

The proof mass may extend around the perimeter of the comb capacitors, such that the comb capacitors are located on the interior of the proof mass.

The proof mass may be connected by springs to a plurality of suspenders, wherein the suspenders are anchored at or close to the centre of the substrate.

The proof mass may be connected to the suspenders by four springs, wherein each spring is connected to the proof mass at an interior corner of the proof mass.

The springs may be arranged into two pairs, and wherein the springs of each pair of springs are connected at a middle point of the spring.

The stationary comb electrodes may be anchored to the substrate at a plurality of anchor points, and wherein the proof mass comprises a central portion which is located interior to the anchor points.

The proof mass may further comprise arm portions which extend towards the exterior of the MEMS accelerometer from the central portion, wherein the moveable comb electrodes are disposed on the arm portions.

The proof mass may be connected to anchor points on the substrate by a plurality of springs which extend around the outside of the proof mass and comb capacitors.

Each spring may comprises an outer portion that extends from an anchor point around the perimeter of the proof mass and comb capacitors to a middle portion, and an inner portion that extends away from the middle portion around the perimeter of the proof mass and comb capacitors towards a connection point on the proof mass, to which the inner portion of the spring is connected.

The accelerometer may comprise two pairs of springs and two spring anchor points located on opposite sides of the proof mass, wherein one spring from each pair extends from each spring anchor point such that the outer portions of the springs extend in opposite directions away from the spring anchor point and such that the middle portions of the springs in each pair are adjacent, wherein the middle portions of each pair of springs are connected.

DETAILED DESCRIPTION

Figure 1:
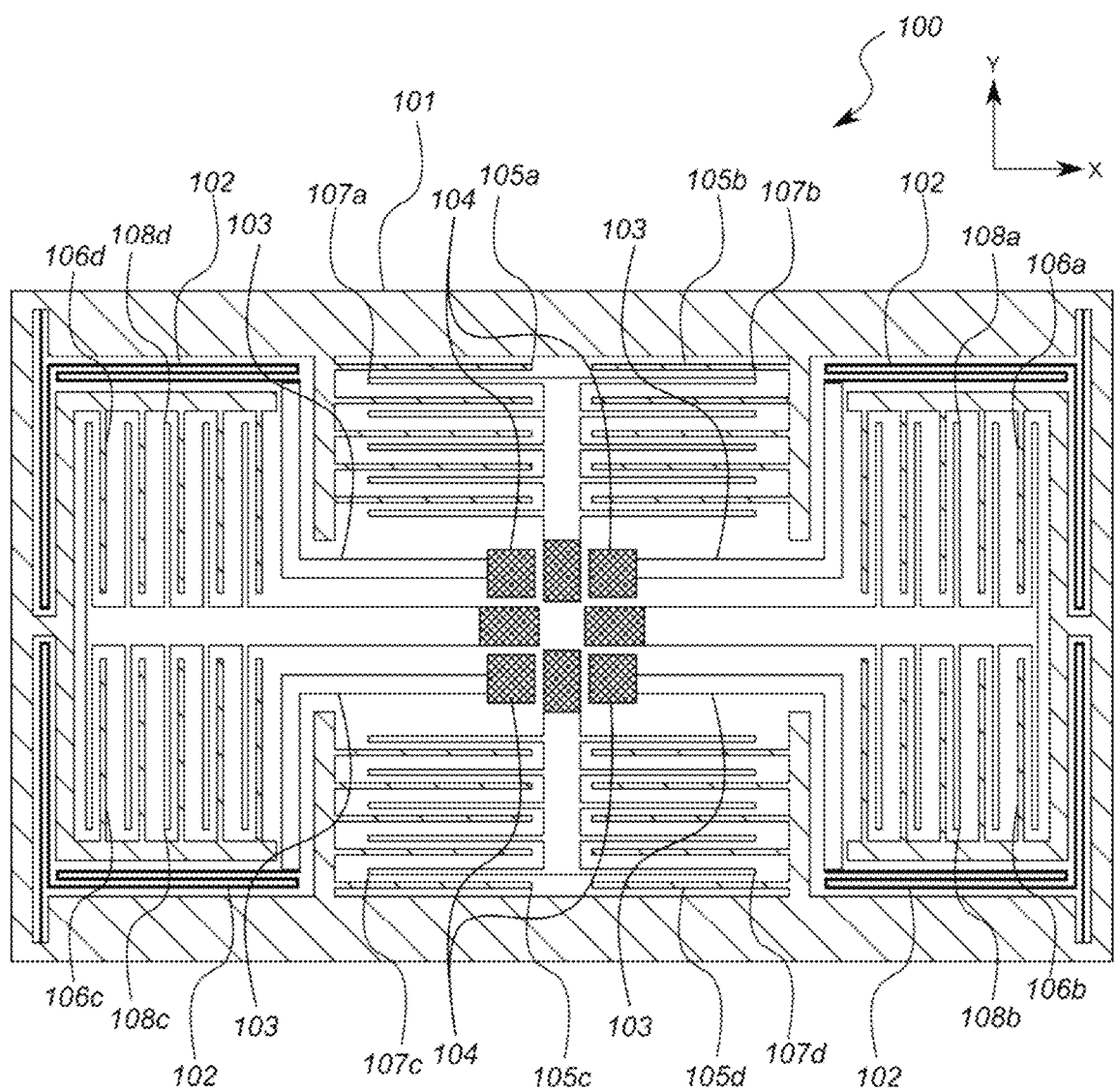
FIG. 1 is a schematic drawing of a MEMS accelerometer according to a first embodiment of the invention.

FIG. 1 shows a schematic drawing of a 2-axis MEMS accelerometer 100 according to the present invention. The view of FIG. 1 is taken through the middle of the structure layer of the MEMS accelerometer 101, i.e. a plane that intersects the structural components of the accelerometer. The structural components are generally formed by subtractive processes (e.g. etching) from a substrate formed from material such as silicon, leaving behind the remaining substrate, which lies below the components depicted in FIG. 1. The components which lie above and separated from the substrate form the structure layer, which is generally arranged in a plane parallel to the plane of the remaining substrate (also referred to as the substrate plane). The substrate is fixed to the accelerometer package, i.e. the surrounding frame and protective elements.

The structure layer includes a proof mass 101, which extends around the perimeter of the device, i.e. extends around the other components of the MEMS accelerometer 100. The proof mass 101 is coupled via springs 102 and arms 103 to anchor points 104. Anchor points 104 are fixed to the substrate (not shown) which lies below the proof mass 101 and other components shown in FIG. 1. The arms 103 are relatively stiff, compared to springs 102, and thus provide essentially fixed points (i.e. fixed relative to the substrate) to which the springs 102 are connected at one end. The springs 102 permit movement of the proof mass 101 within a plane parallel to the substrate plane, but resist movement of the proof mass 101 in directions perpendicular to the substrate plane, i.e. into or out of the plane of the page in FIG. 1.

The proof mass 101 also includes comb electrodes 105*a-d* and 106*a-d*, which, together with comb electrodes 107*a-d* and 108*a-d* form comb capacitors which can be used to measure movement of the proof mass in the X-Y plane. Electrodes 107*a-d* and 108*a-d* are connected by rigid structures to further anchor points, which, like anchor points 104, are fixed to the substrate. As the proof mass 101 moves in the X-Y plane relative to the substrate, i.e. when the MEMS accelerometer experiences acceleration, the distance between the teeth of the comb electrodes in each comb capacitor changes in response and according to the acceleration. The capacitance of the comb capacitors, which is related to the distance between the comb teeth, therefore changes as the proof mass 101 moves relative to the substrate. By measuring the change in capacitance, the acceleration can be measured.

Using a single proof mass for both sense axes provides significantly improves noise performance. The extent to which the proof mass moves under acceleration is proportional to the force exerted on the proof mass, and is thus proportional to both the inertial mass of the proof mass and the acceleration. Thus, the larger the mass, the bigger the force and the larger the deflection of the proof mass under acceleration for a given stiffness of spring 102. A larger deflection leads to a larger change in capacitance which is more easily measure and provides more robust noise performance by both improving the signal to noise ratio in the electronics of the MEMS accelerometer. Furthermore, a higher mass reduces the effect of thermal noise, whereby movement of the proof mass is caused by factors other than the external acceleration of the MEMS accelerometer, such as gas pressure inside the accelerometer package. Increasing the size of the proof mass (and thus increasing its inertial mass) thereby significantly improves the noise performance of the MEMS accelerometer by simultaneously diminishing the effects of both of these sources of noise.

However, using a single proof mass for both sense axes results in the proof mass being free to move along both sense axes X and Y, depicted in FIG. 1. The capacitance of conventional comb capacitors, which are often used to measure movement of the proof mass in prior art accelerometers, is affected not only by the distance between the teeth of the comb capacitors, but also the extent to which the teeth overlap. Movement of the proof mass along both axes therefore causes changes in the capacitance, which makes it difficult to determine the acceleration along each axis independently. In order to solve this problem, the MEMS accelerometer of the present invention uses a new arrangement of electrodes in each comb capacitor in order to passively eliminate changes in capacitance caused by movement along the non-sense axis.

In the device of FIG. 1, two comb capacitors for measuring movement of the proof mass 101 along the X axis are shown, along with two comb capacitors for measurement movement of the proof mass 101 along the Y axis (the sense axis of the capacitor, also referred to as the "capacitor axis"). The first Y axis capacitor is formed from movable electrodes 105a, 105b and stationary electrodes 107a, 107b ("stationary" as in stationary relative to the substrate). The first moveable electrode 105a includes comb teeth that extend away from the proof mass 101 in a first direction parallel to the substrate plane and perpendicular to the Y-axis (i.e. perpendicular to the sense axis), towards the middle of the accelerometer. The comb teeth of a second moveable electrode 105b extend from a symmetrically opposite side of proof mass 101 in a second direction, opposite to the first direction, towards the middle of the accelerometer. The first stationary electrode 107a and second stationary electrode 107b extend from a rigid structure formed that is located between the moveable electrodes 105a, 105b. The first stationary electrode's 107a comb teeth extend towards the first moveable electrode 105a and are interdigitated with the comb teeth of the first moveable electrode 105a. The second stationary electrode's 107b comb teeth extend towards the second moveable electrode 105b and are interdigitated with the comb teeth of the second moveable electrode 105b. The two sets of electrodes 105a, 107a and 105b, 107b form a single capacitor that has mirror symmetry between electrodes.

This arrangement of electrodes means that movement of proof mass 101 in the first direction (i.e. towards the right of the page, as shown in FIG. 1) causes the first moveable electrode 105a and first stationary electrode 107a to move closer together in the direction parallel to the comb fingers, and causes the second moveable electrode and second stationary electrode to move further apart by the same amount. Thus, the increase in capacitance of the electrode pair 105a, 107a caused by the increased area of overlap between the electrodes offset by an equal decrease in capacitance of the electrode pair 105b, 107b caused by the decreased area of overlap between those electrodes. Similarly, movement of the proof mass in the second direction (i.e. to the left of the page, as shown in FIG. 1) causes the area of overlap between the first moveable electrode 105a and first stationary moveable electrode 107a to decrease and causes the area of overlap between the second moveable electrode 105a and second stationary electrode 107b to move increase by the same amount. The increase or decrease in capacitance caused by any change in the area of overlap between the first pair of electrodes 105a, 107a is therefore always offset by an equal decrease or increase in capacitance caused by the equal and opposite change in overlap between the second pair of electrodes 105b, 107b. In this way, the accelerometer shown in FIG. 1 passively compensates for cross-axis error, i.e. changes in the capacitance caused by movement perpendicular to the sense axis.

It will be appreciated that the key principle is the equal and opposite change of area of overlap of the pairs of electrodes that form the capacitor, which is a result of using at least two moveable electrodes with comb teeth extending in opposite directions and at least two corresponding stationary electrodes with comb teeth extending in opposite directions. The precise arrangement of electrodes shown in FIG. 1 (or any other figure) is not essential. For example, the positions of the stationary electrodes 107a, 107b between the moveable electrodes 105a, 105b could be reversed such that the moveable electrodes 105a, 105b are located between the stationary electrodes 107a, 107b instead. The arrangement depicted in FIG. 1 is advantageous because it allows a single anchor point to be used for both stationary electrodes 107a, 107b, which eliminates movement of the stationary electrodes relative to one another due to deformations of the accelerometer, e.g. due to thermal stress or vibrations.

Opposite to the capacitor formed from electrodes 105a, 105b, 107a and 107b is a second Y-axis sense capacitor formed from electrodes 105c, 105d, 107c and 107d. The second Y axis sense capacitor is formed in the same manner as the first capacitor formed from electrodes 105a, 105b, 107a and 107b; however, the second capacitor is a mirror image of the first capacitor about the X-axis, such that as the comb teeth of the first capacitor move closer together due to movement along the Y-axis, the comb teeth of the second capacitor move further apart and vice versa. This enables differential capacitive measurements to be used to determine the extent of the movement of the proof mass 101 and therefore determine the external acceleration.

Furthermore, a first X axis sense capacitor formed from electrodes 106a, 106b, 108a and 108b and a second X axis sense capacitor formed from electrodes 106c, 106d, 108c and 108d are provides in the same manner as described above for the Y axis sense capacitors, but rotated 90 degrees. Consequently, the four capacitors depicted in FIG. 1 allow for movement along the X and Y axes to be sensed independently, while allowing for a single proof mass to be used for both axes in order to improve noise performance.

Moreover, the arrangement of the stationary electrodes 107a-d and 108a-d shown in FIG. 1 allows for all of the stationary electrodes to be anchored close to the centre of the accelerometer, along with the anchor points connected to springs 102. This common placement of the anchor points at the centre of the MEMS accelerometer minimises relative movement of the electrodes 107a-d and 108a-d and the proof mass 101 due to vibration or thermal deformation, further improving the accuracy of the device.

Figure 2:
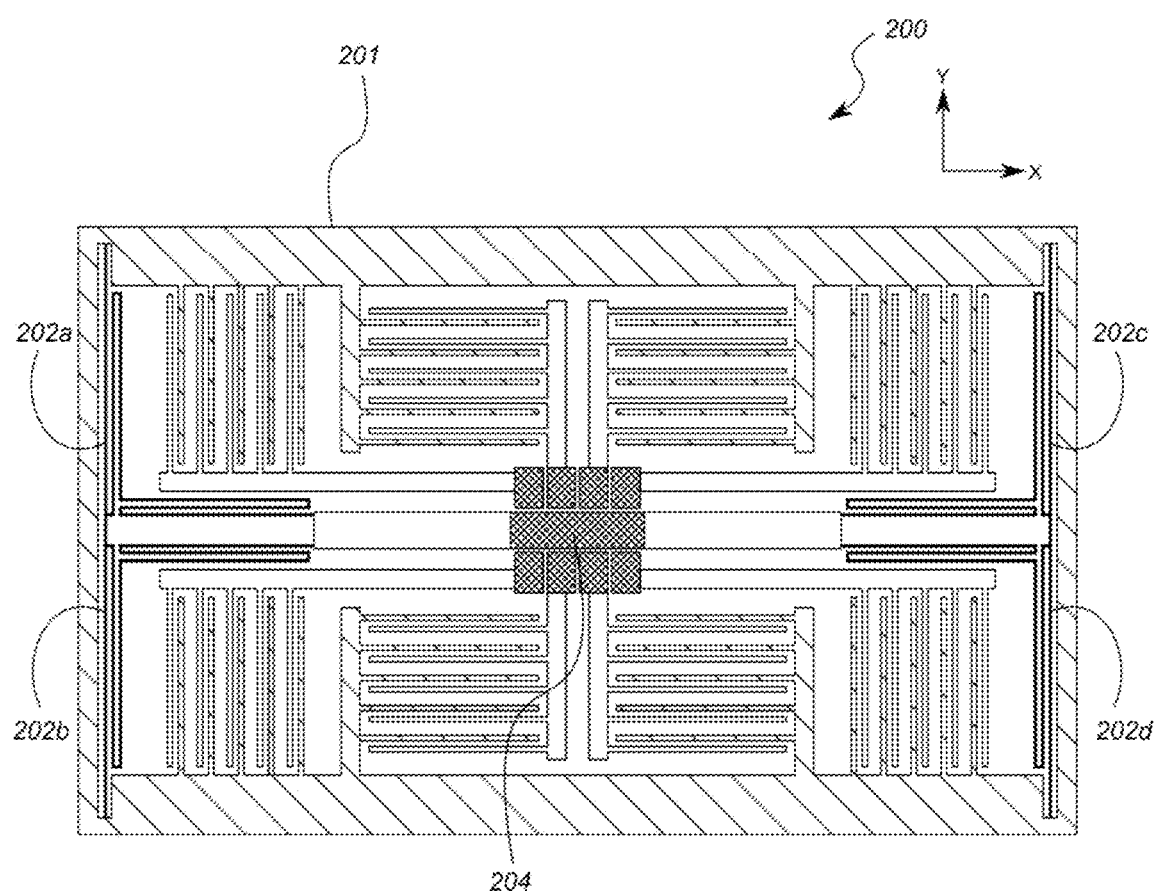
FIG. 2 is a schematic drawing of a MEMS accelerometer according to a second embodiment of the invention.

FIG. 2 depicts a MEMS accelerometer 200 according to a second embodiment of the invention. The MEMS accelerometer 200 includes many of the same features as the MEMS accelerometer 100, for example the single proof mass 201 extending around the perimeter of the accelerometer and the mirrored cross-axis compensating capacitors are in essentially the same configuration in accelerometer 200 as in accelerometer 100 of FIG. 1. Furthermore, the central anchoring of all elements at anchoring point 204 is also present in the MEMS accelerometer of FIG. 2. However, unlike accelerometer 100, pairs of springs 202a, 202b and 202c, 202d, which connect the proof mass 201 to central anchoring point 204, are coupled together at a central point. Each spring 202a-d extends from a rigid structure connected to central anchor point 204 towards one of the interior corners of the proof mass 201, following a serpentine path which increases the length of the spring, thereby reducing its spring constant and allowing for greater movement of the proof mass 201 under acceleration. Springs 202a and 202b, which join adjacent corners of the proof mass 201 to the central anchor point 204 are coupled together at the mid-portions of the springs, where the springs 202a and 202b are closest together. This coupling reduces the ability of the proof mass to rotate within the X-Y plane. Such rotations may be caused by vibrations or other forces acting upon the proof mass which are not related to the linear acceleration along the sense axes. These rotations cause the electrodes of the sense capacitors to move and therefore cause the capacitance to change in a way that is unrelated to the linear X or Y axis acceleration of the device. Thus, minimising rotation of the proof mass 201 through the coupling of springs 202a, 202b and 202c, 202d further improves the accuracy of the device.

Figure 3:
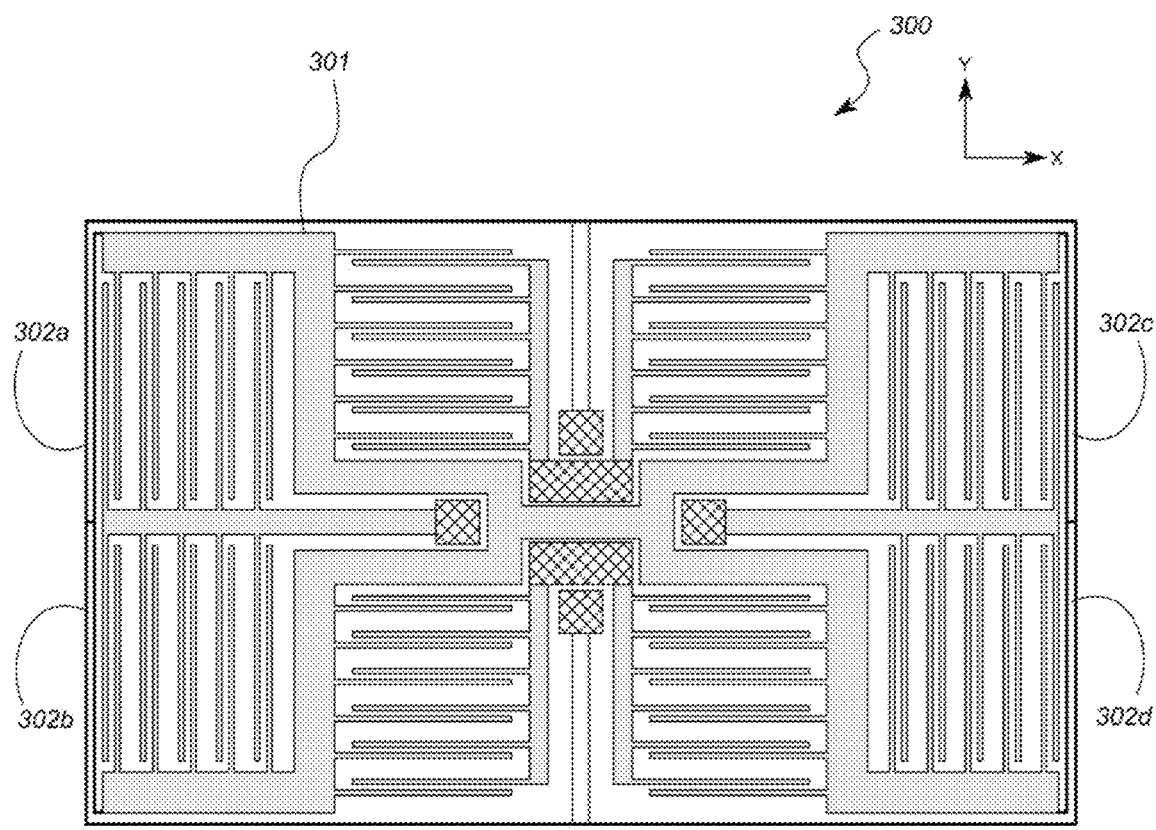
FIG. 3 is a schematic drawing of a MEMS accelerometer according to a third embodiment of the invention.

FIG. 3 depicts a MEMS accelerometer 300 according to a third embodiment of the invention. Like MEMS accelerometer 100 and MEMS accelerometer 200, accelerometer 300 includes a single proof mass 301, which is used to sense acceleration along both X and Y axes. Moveable electrodes attached to the proof mass 301 and stationary electrodes anchored to the substrate form four capacitors which passively eliminate cross-axis error, as in accelerometers 100 and 200. Accelerometer 300 differs in that the proof mass 301 forms a shuttle-like shape which is at least partially disposed in the middle of the accelerometer. From the central portion of the proof mass, four arms extend towards the outer perimeter of the accelerometer. The moveable electrodes which form the sense capacitors extend from these arms. Compared to the proof masses 101, 201 of accelerometers 100 and 200, the moment of inertia of the proof mass 301 is reduced. As a result, there is less mass for an external non-linear (i.e. rotational) acceleration to act upon, resulting in a smaller force to counteract the resistance to rotational motion provided by springs 302. The proof mass 301 is therefore less susceptible to rotational movement, improving accuracy of the accelerometer's measurements of linear acceleration along the X and Y axes.

Springs 302a-d extend around the outside of the proof mass from two centrally located anchor points. Each spring 302 is made up of an outer portion that extends from a rigid structure connected to the anchor point around to a middle portion, and an inner portion that extends away from the middle portion around the perimeter of the proof mass and comb capacitors towards a connection point on the proof mass, to which the inner portion of the spring is connected. Each pairs of springs 302a, 302b and 302c, 302d is coupled at the middle portion of both springs. Like the springs 202 in accelerometer 200, adjacent springs 302 are coupled in order to further reduce rotation of the proof mass.

Figure 4:
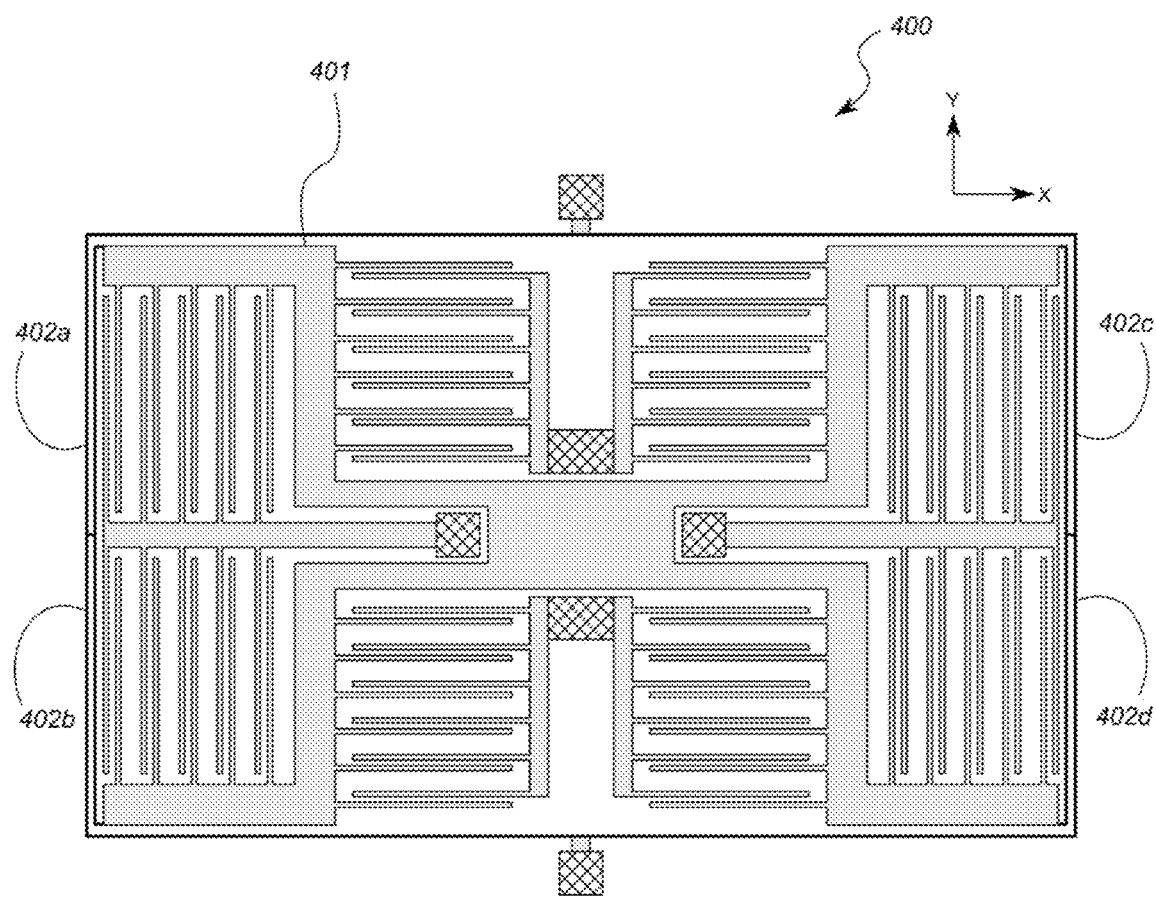
FIG. 4 is a schematic drawing of a MEMS accelerometer according to a fourth embodiment of the invention.

FIG. 4 depicts a fourth embodiment of a MEMS accelerometer 400 according to the present invention. In comparison to the accelerometer 300 of FIG. 3, the accelerometer 400 differs only in that the anchor points for the springs 402a-d are located outside the springs. This arrangement is an alternative configuration to the arrangement shown in FIG. 3 and provides additional space inside the springs for the necessary electrical connections to the various components of the accelerometer.

The invention claimed is:

1. A two-axis MEMS accelerometer, comprising:
a substrate, which defines a substrate plane;
a proof mass; and
four comb capacitors comprising moveable comb electrodes extending from the proof mass and stationary comb electrodes anchored at a center of the substrate;
wherein the proof mass is connected by springs to a plurality of suspenders that are anchored at the center of the substrate;
wherein the four comb capacitors are arranged into two pairs of comb capacitors;
wherein the comb capacitors in each pair of comb capacitors are mirror-images of each other reflected about an axis of reflection;
wherein the axes of reflection of the two pairs of comb capacitors intersect at a central point of the substrate;
wherein either comb capacitor in a first pair of comb capacitors comprises:
 a first set of moveable comb teeth that extend away from the proof mass in a first direction along a capacitor axis of the first pair of comb capacitors, the capacitor axis being parallel to the substrate plane;
 a second set of moveable comb teeth that extend away from the proof mass in a second direction, opposite the first direction, along the capacitor axis of the first pair of comb capacitors;
 a first set of stationary comb teeth opposite to and interdigitated with the first set of moveable comb teeth, wherein the first set of stationary comb teeth extend towards the proof mass in the second direction; and
 a second set of stationary comb teeth opposite to and interdigitated with the second set of moveable comb teeth, wherein the second set of stationary comb teeth extend towards the proof mass in the first direction;
wherein either comb capacitor in a second pair of comb capacitors comprises:
 a first set of moveable comb teeth that extend away from the proof mass in a third direction along a capacitor axis of the second pair of comb capacitors, the capacitor axis of the second pair of comb capacitors being perpendicular to the capacitor axis of the first pair of comb capacitors;
 a second set of moveable comb teeth that extend away from the proof mass in a fourth direction, opposite the third direction, along the capacitor axis of the second pair of comb capacitors;
 a first set of stationary comb teeth opposite to and interdigitated with the first set of moveable comb teeth, wherein the first set of stationary comb teeth extend towards the proof mass in the fourth direction; and
 a second set of stationary comb teeth opposite to and interdigitated with the second set of moveable comb teeth, wherein the second set of stationary comb teeth extend towards the proof mass in the third direction;

wherein in either comb capacitor in a first pair of comb capacitors, movement of the proof mass in the first direction causes an area of overlap between the first set of moveable comb teeth and first set of stationary comb teeth to increase and causes an area of overlap between the second set of moveable comb teeth and second set of stationary teeth to decrease, and wherein movement of the proof mass in the second direction causes an area of overlap between the first set of moveable comb teeth and first set of stationary comb teeth to decrease and causes an area of overlap between the second set of moveable comb teeth and second set of stationary teeth to increase; and wherein in either comb capacitor in a second pair of comb capacitors, movement of the proof mass in the third direction causes an area of overlap between the first set of moveable comb teeth and first set of stationary comb teeth to increase and causes an area of overlap between the second set of moveable comb teeth and second set of stationary teeth to decrease, and wherein movement of the proof mass in the fourth direction causes an area of overlap between the first set of moveable comb teeth and first set of stationary comb teeth to decrease and causes an area of overlap between the second set of moveable comb teeth and second set of stationary teeth to increase.

2. The two-axis MEMS accelerometer of claim 1, wherein movement of the proof mass in the first direction causes the area of overlap between the first set of moveable comb teeth and first set of stationary comb teeth in the first pair of comb capacitors to increase by a first amount and causes the area of overlap between the second set of moveable comb teeth and second set of stationary teeth in the first pair of comb capacitors to decrease by the first amount, wherein movement of the proof mass in the second direction causes the area of overlap between the first set of moveable comb teeth and first set of stationary comb teeth in the first pair of comb capacitors to decrease by a second amount and the area of overlap between the second set of moveable comb teeth and second set of stationary teeth in the first pair of comb capacitors to increase by the second amount.

3. The two-axis MEMS accelerometer of claim 2, wherein movement of the proof mass in the third direction causes both the first moveable comb teeth and first stationary comb teeth and the second moveable comb teeth and second stationary comb teeth of a first comb capacitor in the first pair of comb capacitors to move further apart, and causes both the first moveable comb teeth and first stationary comb teeth and the second moveable comb teeth and second stationary comb teeth of a second comb capacitor in the first pair of comb capacitors to move closer together, wherein movement of the accelerometer in the fourth direction causes both the first moveable comb teeth and first stationary comb teeth and the second moveable comb teeth and second stationary comb teeth of the first comb capacitor in the first pair of comb capacitors to move closer together, and causes both the first moveable comb teeth and first stationary comb teeth and the second moveable comb teeth and second stationary comb teeth of the second comb capacitor in the first pair of comb capacitors to move further apart.

4. The two-axis MEMS accelerometer of claim 1, wherein the two pairs of comb capacitors are configured such that a capacitor axis of the first pair of comb capacitors lies along or parallel to a first axis, which is parallel to the substrate plane, and a capacitor axis of the second pair of comb capacitors lies along or parallel to a second axis, which is parallel to the substrate plane and perpendicular to the first axis.

5. The two-axis MEMS accelerometer of claim 1, wherein in the two pairs of comb capacitors, the axis of reflection is parallel to the capacitor axis of the other pair of comb capacitors.

6. The two-axis MEMS accelerometer of claim 1, wherein the stationary electrodes are anchored to the substrate at the center of the substrate.

7. The two-axis MEMS accelerometer of claim 1, wherein the proof mass extends around a perimeter of the comb capacitors, such that the comb capacitors are located on the interior of the proof mass.

8. The two-axis MEMS accelerometer of claim 7, wherein the proof mass is connected to the suspenders by four springs, wherein each spring is connected to the proof mass at an interior corner of the proof mass.

9. The two-axis MEMS accelerometer of claim 8, wherein the springs are configured in two pairs, and wherein the springs of each pair of springs are connected at a middle point of the spring.

10. The two-axis MEMS accelerometer of claim 1, wherein the stationary comb electrodes are anchored to the substrate at a plurality of anchor points, and wherein the proof mass comprises a central portion which is located interior to the anchor points.

11. The two-axis MEMS accelerometer of claim 10, wherein the proof mass further comprises arm portions which extend towards the exterior of the MEMS accelerometer from the central portion, wherein the moveable comb electrodes are disposed on the arm portions.

12. The two-axis MEMS accelerometer of claim 11, wherein the proof mass is connected to anchor points on the substrate by a plurality of springs which extend around an outside of the proof mass and comb capacitors.

13. The two-axis MEMS accelerometer of claim 12, wherein each spring comprises an outer portion that extends from an anchor point around a perimeter of the proof mass and comb capacitors to a middle portion, and an inner portion that extends away from the middle portion around the perimeter of the proof mass and comb capacitors towards a connection point on the proof mass, to which the inner portion of the spring is connected.

14. The two-axis MEMS accelerometer of claim 13, wherein the accelerometer comprises two pairs of springs and two spring anchor points located on opposite sides of the proof mass, wherein one spring from each pair extends from each spring anchor point such that the outer portions of the springs extend in opposite directions away from the spring anchor point and such that the middle portions of the springs in each pair are adjacent, wherein the middle portions of each pair of springs are connected.

* * * * *